United States Patent
Nilsson et al.

(10) Patent No.: US 9,344,318 B2
(45) Date of Patent: May 17, 2016

(54) RADIO RECEIVER FOR CARRIER AGGREGATION

(71) Applicant: Telefonaktiebolaget L M Ericsson (publ), Stockholm (SE)

(72) Inventors: Magnus Nilsson, Lund (SE); Peter Jakobsson, Lund (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 14/768,380

(22) PCT Filed: Sep. 10, 2014

(86) PCT No.: PCT/EP2014/069280
§ 371 (c)(1),
(2) Date: Aug. 17, 2015

(65) Prior Publication Data
US 2016/0072656 A1    Mar. 10, 2016

(51) Int. Cl.
*H04L 27/00* (2006.01)
*H04L 27/26* (2006.01)
*H04B 1/00* (2006.01)
*H04L 5/00* (2006.01)

(52) U.S. Cl.
CPC .......... *H04L 27/2647* (2013.01); *H04B 1/0067* (2013.01); *H04L 5/001* (2013.01)

(58) Field of Classification Search
CPC .... H04B 1/0057; H04B 1/005; H04B 1/0053; H04B 1/006; H04L 5/001
USPC .......................................................... 375/316
See application file for complete search history.

(56) References Cited

U.S. PATENT DOCUMENTS

| 2008/0299926 | A1 | 12/2008 | Becker et al. | |
| 2012/0106674 | A1* | 5/2012 | Lee | H04L 5/001 375/296 |
| 2013/0051284 | A1 | 2/2013 | Khlat et al. | |
| 2013/0244722 | A1* | 9/2013 | Rousu | H04B 1/0057 455/552.1 |
| 2015/0334710 | A1* | 11/2015 | Tang | H04W 72/0453 370/329 |

FOREIGN PATENT DOCUMENTS

| EP | 2590351 A2 | 5/2013 |
| WO | 2012109262 A1 | 8/2012 |

* cited by examiner

*Primary Examiner* — David S Huang
(74) *Attorney, Agent, or Firm* — Murphy, Bilak & Homiller, PLLC

(57) ABSTRACT

A radio receiver circuit (10) configurable to operate in a carrier-aggregation, CA, mode and in a non-CA mode is disclosed. It comprises a first receive path (30) arranged to be operatively connected to an antenna (15) and a second receive path (40) arranged to be operatively connected to the same antenna (15). It further comprises a control unit (50) operatively connected to the first receive path (30) and the second receive path (40). In the CA mode, the control unit (50) controls the first receive path (30) to receive a first CC (6) and the second receive path to receive a second CC (8). In the non-CA mode, the control unit (50) selectively controls the first receive path (30) and the second receive path (40) to both receive the same single CC (6).

17 Claims, 6 Drawing Sheets

RADIO RECEIVER FOR CARRIER AGGREGATION

TECHNICAL FIELD

The present invention relates to radio receiver circuits capable of operation in carrier-aggregation scenarios.

BACKGROUND

In cellular communications networks, wireless terminals, sometimes referred to as UEs (User Equipment), communicate wirelessly with base stations of the cellular communications network. In the downlink, from the base station to the UE, the UE may receive signals in a single frequency band associated with a single radio-frequency (RF) carrier. In order to improve the capacity (e.g. in terms of downlink bitrate), the concept of carrier aggregation (CA) has been introduced in 3GPP (3rd Generation Partnership Program) standards. Using CA, the UE may simultaneously receive a plurality of RF carriers. These RF carriers are normally referred to as component carriers, or CCs. On each CC there is modulated an information signal, e.g. an OFDMA (Orthogonal Frequency Division Multiple Access) signal or a CDMA (Code-Division Multiple Access) signal, carrying payload data and/or control information. The CCs may be located within the same operating frequency band, in which case the CA is referred to as intra-band CA. Alternatively, the CCs may be located within different operating frequency bands, in which case the CA is referred to as inter-band CA. For intra-band CA, the plurality of CCs may be located contiguously (in frequency), in which case the CA is referred to as contiguous CA, or may be non-contiguously located (in frequency) with frequency gaps in between, in which case the CA is referred to as non-contiguous CA. In one scenario, the UE may be allocated a primary CC (PCC) associated with a primary cell (PCell) of the cellular communications network. When an increase in downlink capacity is needed, for whatever reason, the UE may additionally be allocated one or more secondary CCs (SCCs) associated with respective secondary cells (SCells).

One solution for enabling the UE to receive a plurality of CCs, particularly in a non-contiguous CA scenario, is to use a receiver circuit with a plurality of receive paths, each connected to the same antenna, e.g. via a common low-noise amplifier (LNA). Each receive path may be responsible for reception of a particular one of the plurality of CCs. For example, each receive path may be of direct-conversion type, comprising a mixer unit driven by an LO signal having a frequency selected such that the mixer unit directly down-converts the particular CC to base band. The LO-signal frequency of each processing path may thus be selected in dependence of the RF frequency of the CC it is set to receive.

SUMMARY

Embodiments of the present invention are based on an insight that receiver circuitry intended for CA operation may be efficiently reused in non-CA (or "single carrier") operation for boosting the performance.

According to a first aspect, there is provided a radio receiver circuit configurable to operate in a CA mode, wherein the radio receiver circuit is to receive a plurality of component carriers (CCs), and in a non-CA mode, wherein the radio receiver circuit is to receive a single CC. The radio receiver circuit comprises a first receive path arranged to be operatively connected to an antenna and a second receive path arranged to be operatively connected to the same antenna. Furthermore, the radio receiver circuit comprises a control unit operatively connected to the first receive path and the second receive path. The control unit is adapted to, in the CA mode, control the first receive path to receive a first CC of said plurality of CCs and control the second receive path to receive a second CC, separate from the first CC, of said plurality of CCs. Moreover, the control unit is adapted to, in the non-CA mode, selectively control the first receive path and the second receive path to both receive the same single CC.

The radio receiver circuit may comprise a low-noise amplifier arranged to operatively connect both the first receive path and the second receive path to the antenna.

The first receive path may comprise a mixer unit arranged to be driven by a first local oscillator (LO) signal. The second receive path may comprise a mixer unit arranged to be driven by a second LO signal. The control unit may be adapted to, in the CA mode, control the frequency of the first LO signal to enable reception of the first CC by the first receive path and control the frequency of the second LO signal to enable reception of the second CC by the second receive path.

The control unit may be adapted to, in the non-CA mode and in order to enable reception of the same single CC by both the first receive path and the second receive path, control the frequency of the first LO signal to be the same as the frequency of the second LO signal.

The radio receiver circuit may comprise processing circuitry arranged to, in the non-CA mode, combine an output signal of the first receive path with an output signal of the second receive path, thereby generating a combined output signal. The control unit may be adapted to, in the non-CA mode, control at least one of a gain and a frequency bandwidth of the first receive path to be the same as that of the second receive path when the first receive path and the second receive path are controlled to both receive the same signal in said single frequency band The radio receiver circuit may comprise processing circuitry arranged to, in the non-CA mode, separately process an output signal of the first receive path and an output signal of the second receive path, thereby generating a first processed signal and a second processed signal, respectively. The control unit may be adapted to, in the non-CA mode, control a gain of one of the first receive path and the second receive path to be higher than a gain of the other one of the first receive path and the second receive path when the first receive path and the second receive path are controlled to both receive the same single CC. The processing circuitry may be arranged to perform signal-strength measurements on the output signal from the first receive path and on the output signal from the second receive path, for example to determine a gain setting to be used during further reception in the non-CA mode.

The control unit may be adapted to, in the non-CA mode, selectively disable the second receive path.

The radio receiver circuit may be adapted to operate in a cellular communication system.

According to a second aspect, there is provided a radio communication apparatus comprising a radio receiver circuit according to the first aspect and an antenna, to which both the first receive path and the second receive path of the radio receiver circuit are operatively connected.

The radio communication apparatus may be a terminal for a cellular communication system. The terminal may for example be a mobile telephone, a tablet computer, a portable computer, or a machine-type communication device.

According to a third aspect, there is provided a method of operating a radio receiver circuit configurable to operate in a CA mode, wherein the radio receiver circuit is to receive a plurality of component carriers (CCs), and in a non-CA mode, wherein the radio receiver circuit is to receive a single CC. The radio receiver circuit comprises a first receive path operatively connected to an antenna, a second receive path operatively connected to the same antenna, and a control unit operatively connected to the first receive path and the second receive path. The method comprises controlling, in the CA mode and by the control unit, the first receive path to receive a first CC of said plurality of CCs and the second receive path to receive a second CC, separate from the first CC, of said plurality of CCs. Furthermore, the method comprises selectively controlling, in the non-CA mode and by the control unit, the first receive path and the second receive path to both receive the same single CC.

According to a fourth aspect, there is provided a computer program product comprising computer program code for executing the method according to the third aspect when said computer program code is executed by the control unit of the radio receiver circuit According to a fifth aspect, there is provided a computer readable medium (such as a non-transitory computer readable medium) having stored thereon a computer program product comprising computer program code for executing the method according to the third aspect when said computer program code is executed by the control unit of the radio receiver circuit. The computer readable medium may e.g. be a non-transitory computer readable medium.

Further embodiments are defined in the dependent claims. It should be emphasized that the term "comprises/comprising" when used in this specification is taken to specify the presence of stated features, integers, steps, or components, but does not preclude the presence or addition of one or more other features, integers, steps, components, or groups thereof.

BRIEF DESCRIPTION OF THE DRAWINGS

Further objects, features and advantages of embodiments of the invention will appear from the following detailed description, reference being made to the accompanying drawings, in which.

DETAILED DESCRIPTION

Figure 1:
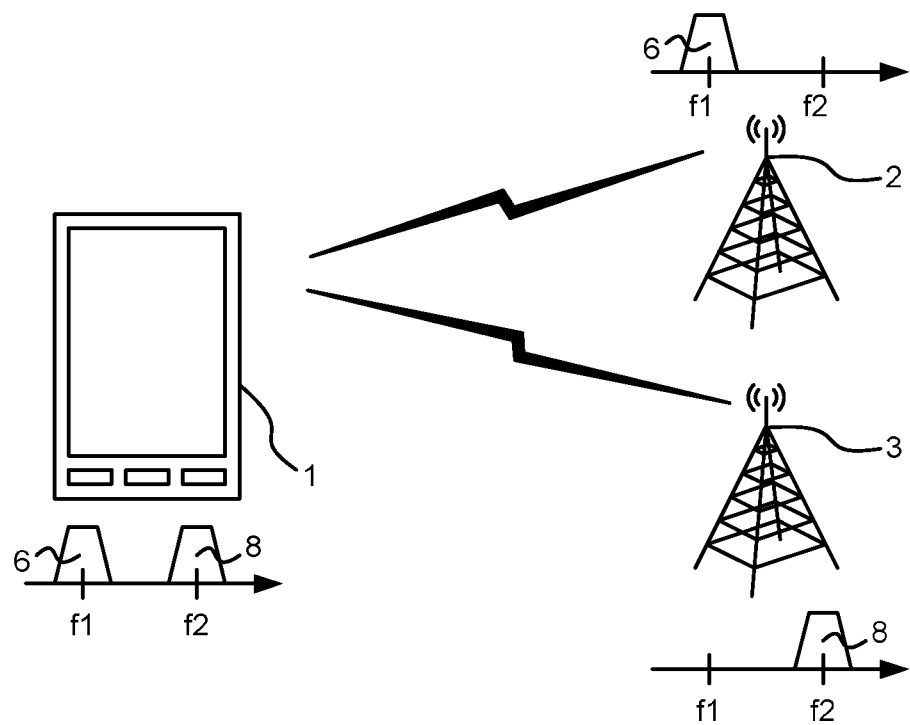
FIGS. 1-2 illustrate scenarios in which embodiments of the present invention may be employed.
Figure 2:
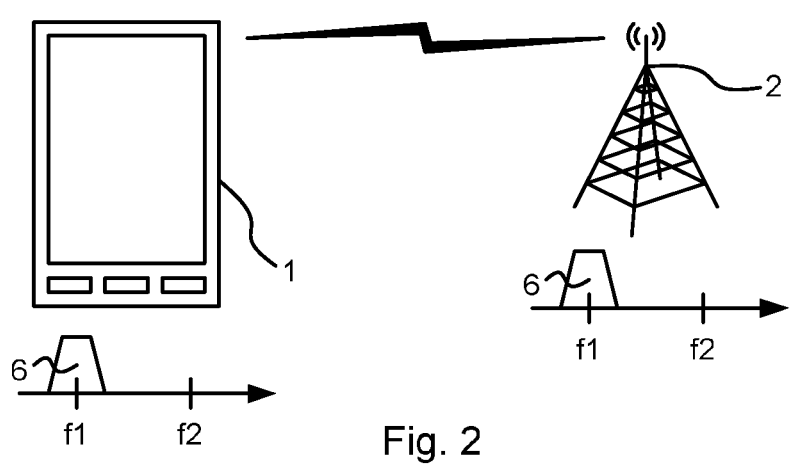

FIGS. 1 and 2 illustrate communication environments wherein embodiments of the present invention may be employed.

In FIG. 1, a radio-communication apparatus 1, illustrated as a terminal 1 for a cellular communication system, is in wireless communication with a cellular communication system in a carrier aggregation (CA) mode. In the figures, the terminal 1 is depicted as a mobile telephone (or "cellular telephone", such as a so called smartphone), but it can also be any other type of terminal for a cellular communication system, such as a tablet computer, a portable computer, or a machine-type communication device (e.g. a sensor, sensor system, or similar arranged to communicate via a cellular communication system). For brevity, the radio-communication apparatus 1 is in the following referred to as "the terminal 1". In the CA mode, a radio-receiver circuit (further described below) of the terminal 1 is arranged to receive a plurality of (downlink) component carriers (CCs), which may be contiguous or non-contiguous. Normally, one of the CCs is a PCC of a PCell (described in the background section above), and the other CCs are SCCs of SCells (also described in the background section above). In FIG. 2, the plurality of CCs comprises a first frequency CC 6 at a first (RF) carrier frequency f1 and a second CC 8, which is separate from the first CC 6, at a second (RF) carrier frequency f2. The first CC 6 may e.g. be the PCC, and the second CC 8 may e.g. be an SCC, or vice versa. In general, as there may be more than one SCell, there may be more than two CCs in the plurality of CCs. In FIG. 1, the first CC 6 is illustrated as transmitted from a first base station 2, and the second CC 8 is illustrated as transmitted from a second base station 3, but in general they may also be transmitted from the same base station. The base station or base stations 2, 3 may e.g. be from the group of macro base stations, such as a NodeB of a UTRAN (Universal Terrestrial Radio Access Network) or an eNodeB of an eUTRAN (evolved UTRAN), micro, pico, and femto base stations, but may also be other kinds of current or future base stations. Furthermore, in FIG. 1, the first and second CCs 6,8 are illustrated as non-contiguous (or non-adjacent) CCs having a frequency gap between them, but in other embodiments or scenarios, they may be contiguous (or adjacent) CCs.

In FIG. 2, the terminal 1 is in wireless communication with the cellular communication system in a non-CA mode. In the non-CA mode, the radio receiver circuit of the terminal 1 is arranged to receive a single CC. In FIG. 2, the single CC is illustrated as the same CC as the first CC 6 from the first base station 2 in FIG. 1, but may well be some other CC (such as but not limited to the second CC 8 in FIG. 1) and/or from some other base station (such as but not limited to the second base station 3 in FIG. 1).

Figure 3:
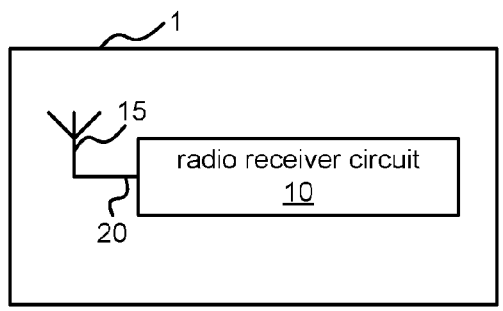
FIGS. 3-8 show block diagrams according to embodiments of the present invention.

FIG. 3 shows a simplified block diagram of a part of the terminal 1 according to an embodiment. The above-mentioned radio receiver circuit is denoted with reference number 10. It is operatively connected to an antenna 15 of the terminal 10 via an antenna port 20 of the radio receiver circuit 10. The terminal 1 may naturally also comprise many other parts as well, such as one or more transmitters, one or more processors, input and output devices (e.g. buttons, displays, touchscreens, etc), etc. For simplicity, such other parts are not shown in FIG. 3.

Figure 4:
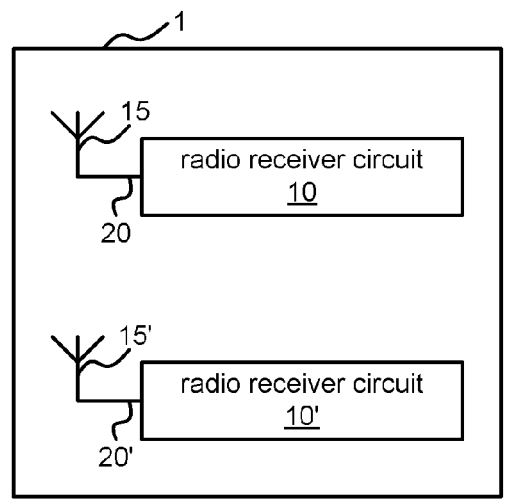

In FIG. 3, the terminal 1 is illustrated as having a single antenna 15. In other embodiments, the terminal 1 may have multiple antennas. For example, the terminal 1 may have multiple receive antennas for diversity reception. This is illustrated in FIG. 4, which shows a simplified block diagram of another embodiment of the terminal 1. As in the embodiment of FIG. 1, the embodiment of the terminal 1 in FIG. 4 comprises the radio receiver circuit 10 operatively connected to the antenna 15 of the terminal 1 via the antenna port 20 of the radio receiver circuit 10. In addition, the terminal 1 comprises another radio receiver circuit 10' and another antenna 15', wherein the radio receiver circuit 10' is operatively connected to the antenna 15' of the terminal 1 via an antenna port 20' of the radio receiver circuit 10'. In the following, embodiments of the radio receiver circuit 10 are described. The radio receiver circuit 10' may e.g. be designed in the same way as the radio receiver circuit 10.

Figure 5:
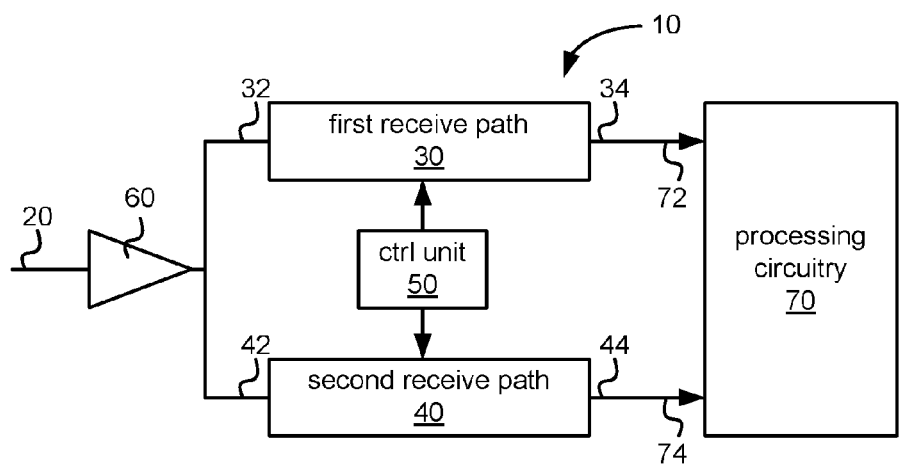

FIG. 5 shows a block diagram of an embodiment of the radio receiver circuit 10. As indicated above, the radio receiver circuit 10 is configurable to operate in a CA mode, wherein the radio receiver circuit 10 is to receive a plurality of CCs, such as the CCs 6 and 8 (FIG. 1). Furthermore, the radio receiver circuit 10 is configurable to operate in a non-CA mode, wherein the radio receiver circuit 10 is to receive a single CC, such as the CC 6 (FIG. 2). The radio receiver circuit 10 may for example be adapted to operate in a cellular communication system.

The radio receiver circuit 10 comprises a first receive path 30 arranged to be operatively connected to the antenna. In the embodiment illustrated in FIG. 5, the first receive path 30 has an input port 32 arranged to be operatively connected to the antenna 15. Furthermore, in the embodiment illustrated in FIG. 5, the first receive path 30 has an output port 34 arranged to provide an output signal of the first receive path 30.

Furthermore, the radio receiver circuit 10 comprises a second receive path 40 arranged to be operatively connected to the same antenna 15. In the embodiment illustrated in FIG. 5, the second receive path 40 has an input port 42 arranged to be operatively connected to the antenna 15. Furthermore, in the embodiment illustrated in FIG. 5, the second receive path 40 has an output port 44 arranged to provide an output signal of the second receive path 40.

In the embodiment illustrated in FIG. 5, the radio receiver circuit 10 comprises an LNA (Low-Noise Amplifier) 60 common to the first receive path 30 and the second receive path 40. The LNA 60 is arranged to operatively connect both the first receive path 30 and the second receive path 40 to the antenna 15, via the antenna port 20 of the radio receiver circuit 10. In other embodiments, the radio receiver circuit 10 may comprise separate LNAs arranged to operatively connect the first receive path 30 and the second receive path 40, respectively, to the antenna 15, via the antenna port 20 of the radio receiver circuit 10.

The radio receiver circuit 10 further comprises a control unit 50 operatively connected to the first receive path 30 and the second receive path 40 for controlling the operation of the first receive path 30 and the second receive path 40. Moreover, in the embodiment illustrated in FIG. 5, the radio receiver circuit 10 comprises processing circuitry 70 operatively connected to the first receive path 30 and the second receive path 40 and arranged to process the output signals from the first receive path 30 and the second receive path 40. As illustrated in FIG. 5, the processing circuitry 70 may have an input port 72 connected to the output port 34 of the first receive path 30, and an input port 74 connected to the output port 44 of the second receive path 40. The processing circuitry 70 may for example comprise, be, or be part of a digital signal processor, such as a baseband processor of the radio receiver circuit 10. Similarly, the control unit 50 may comprise, be, or be part of a digital signal processor, such as a baseband processor of the radio receiver circuit 10, potentially the same digital signal processor as for the processing circuitry 70 mentioned in the preceding sentence.

The control unit 50 is adapted to, in the CA mode, control the first receive path 30 to receive a first CC 6 of said plurality of frequency bands and control the second receive path to receive a second CC 8 of said plurality of CCs. The processing circuitry 70 can then process the output signals from the first receive path 30 and the second receive path 40, e.g. according to well-known techniques, including for example demodulation and decoding of the output signals, to recover the data transmitted on the signals in the respective frequency bands.

The inventors have realized that, in the non-CA mode, hardware used for CA-reception in the CA mode can be efficiently reused for increasing the dynamic range of the radio receiver circuit 10 in situations where such an increased dynamic range is needed. Examples of such situations identified by the inventors are situations where the received signal is relatively weak, situations with presence of blocking interferer(s), and during signal measurements when the strength of the received signal is initially unknown to the radio receiver circuit 10. This can be achieved by, in the non-CA mode, controlling both the first receive path 30 and the second receive path 40 to both receive the same single CC 6. There are different alternatives for how the processing circuitry 70 can process the output signals from the first receive path and the second receive path, examples of which are described further below in the context of various embodiments. Accordingly, in accordance with embodiments of the present invention, the control unit 50 is adapted to, in the non-CA mode, selectively control the first receive path 30 and the second receive path 40 to both receive the same single CC 6.

Using both the first receive path 30 and the second receive path 40 to both receive the same single CC 6 leads to a higher power consumption compared with using only one of the receive paths (say the first receive path 30) while disabling the other receive path (say the second receive path 40). Therefore, according to some embodiments, it is suggested to avoid using both the first receive path 30 and the second receive path 40 to both receive the same single CC 6 unless the additional dynamic range provided by doing so is actually needed. Therefore, according to some embodiments, the control unit 50 is adapted to, in the non-CA mode, selectively disable the second receive path 40.

Figure 6:
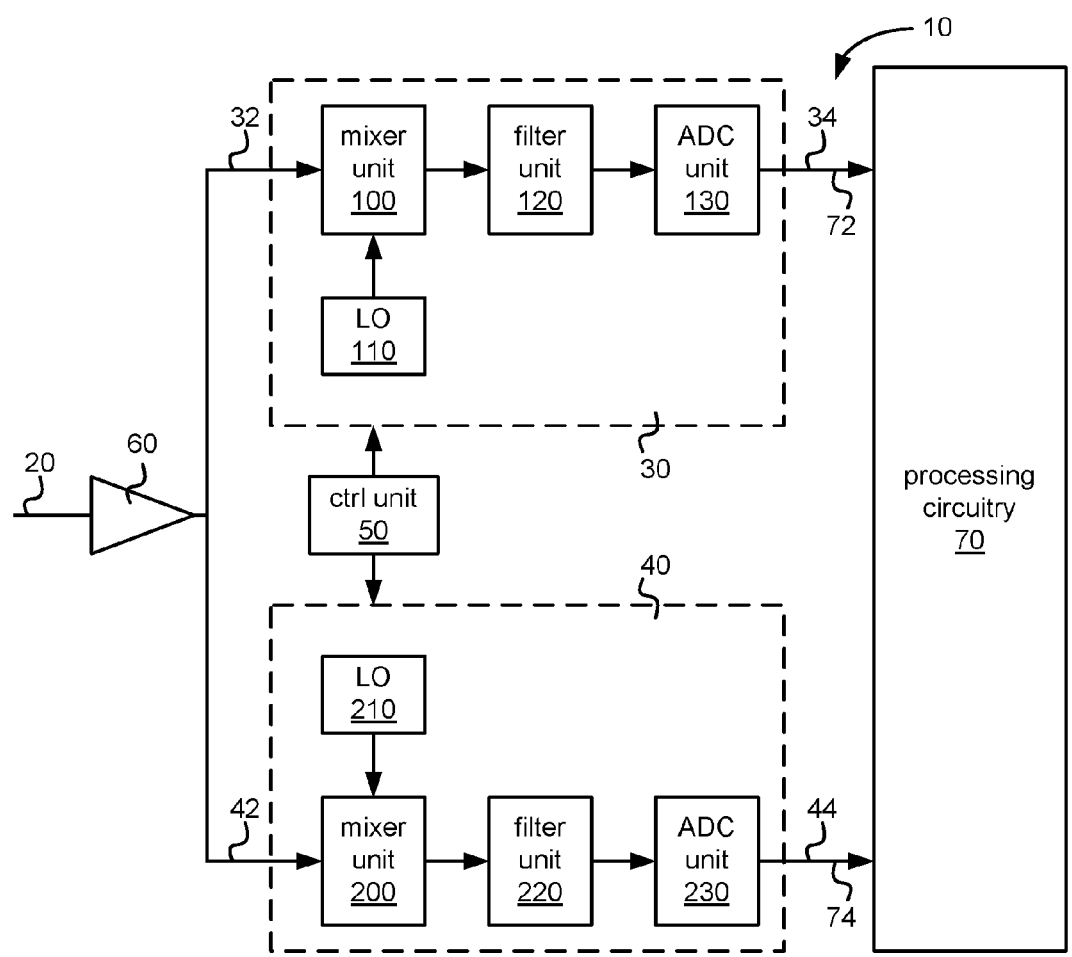

FIG. 6 is a block diagram of an embodiment of the radio receiver circuit 10, showing some more details than the block diagram in FIG. 5. As illustrated in FIG. 6, the first receive path 30 may comprise a mixer unit 100 arranged to be driven by a first local oscillator (LO) signal. Furthermore, as illustrated in FIG. 6, the second receive path 40 may comprise a mixer unit 200 arranged to be driven by a second LO signal. To facilitate CA reception, the control unit 50 may be adapted to, in the CA mode, control the frequency of the first LO signal to enable reception of the first CC 6 by the first receive path 30 and control the frequency of the second LO signal to enable reception of the second CC 8 by the second receive path 40.

In some embodiments, the first LO signal and the second LO signal are distinct LO signals generated by distinct LO units. For example, as illustrated in FIG. 6, the first receive path 30 may comprise a LO unit 110 arranged to generate the first LO signal, and the second receive path 40 may comprise a separate LO unit 210 arranged to generate the second LO signal. The first receive path 30 and the second receive path 40 may then, for example, both operate as direct conversion receivers. In that case, the control unit 50 may be adapted to, in the CA mode, control the frequency of the first LO signal and the frequency of the second LO signal to be equal, or approximately equal, to the center frequency f1 of the first CC 6 and the center frequency f2 of the second CC 8, respectively. Furthermore, in order to enable reception of the same single CC 6 by both the first receive path 30 and the second receive path 40 in the non-CA mode, the control unit 50 may be adapted to, in the non-CA mode, control the frequency of the first LO signal to be the same as the frequency of the second LO signal. This same frequency may, for instance, be equal, or approximately equal, to the center frequency f1 of the single CC 6, in which case both the first receive path 30 and the second receive path 40 are arranged to operate as direct-conversion receivers.

In some embodiments, the first LO signal and the second LO signal may, at least in the non-CA mode, be the same LO signal, generated by a common LO unit (e.g. the LO unit 110 or the LO unit 210 in FIG. 6) comprised in the radio receiver circuit 10.

The LO units mentioned above may be any kind of suitable circuit capable of synthesizing the LO signals in question. For example, the LO units may be or comprise a phase-locked loop (PLL) or similar circuit. Such circuits are well-known in the art of radio receiver circuit design and are therefore not described in any further detail.

In some embodiments, the mixer units 100 and 200 (FIG. 6) are implemented as quadrature mixers. Quadrature mixers are capable of rejecting image-signal components generated in the down-conversion process, and are therefore beneficially used in many radio receiver circuits. A quadrature mixer has an in-phase (I) branch, arranged to generate an I output signal of the quadrature mixer and comprising a mixer, referred to as the I mixer, driven by an I component of the LO signal. Furthermore, a quadrature mixer has a quadrature-phase (Q) branch, arranged to generate a Q output and comprising a mixer, referred to as the Q mixer, driven by a Q component of the LO signal. The I and Q components of the LO signal both have the same frequency, but a mutual 90-degree (or $\pi/4$ rad) phase shift. An LO signal comprising an I and a Q component can be referred to as a quadrature LO signal. The LO units mentioned above might therefore be quadrature LO units, i.e. LO units capable of generating quadrature LO signals. Such quadrature LO units are well known in the art of radio receiver circuit design and therefore not described in any further detail.

As is further illustrated in FIG. 6, the first receive path 30 may comprise a filter unit 120 operatively connected, at an input port of the filter unit 120, to an output port of the mixer unit 100. Furthermore, as is also illustrated in FIG. 6, the first receive path 30 may comprise an analog-to-digital converter (ADC) unit 130 operatively connected, at an input port of the ADC unit 130, to an output port of the filter unit 120. The ADC unit 130 may be arranged to generate the output signal of the first receive path 30 as a digital output signal on the output port 34 of the first receive path 30. The filter unit 120 may be arranged to perform one or more of the tasks of: channel selection filtering and acting as an anti-aliasing filtering for the ADC unit 130. In embodiments where the mixer unit 100 is a quadrature mixer, the filter unit 120 may comprise a separate filter for each of the I and the Q branch, and similarly, the ADC unit 130 may comprise a separate ADC for each of the I and Q branch.

Similarly, as is also illustrated in FIG. 6, the second receive path 40 may comprise a filter unit 220 operatively connected, at an input port of the filter unit 220, to an output port of the mixer unit 200. Furthermore, as is also illustrated in FIG. 6, the second receive path 40 may comprise an ADC unit 230 operatively connected, at an input port of the ADC unit 230, to an output port of the filter unit 220. The ADC unit 230 may be arranged to generate the output signal of the second receive path 40 as a digital output signal on the output port 44 of the second receive path 40. The filter unit 220 may be arranged to perform one or more of the tasks of: channel selection filtering and acting as an anti-aliasing filtering for the ADC unit 230. In embodiments where the mixer unit 200 is a quadrature mixer, the filter unit 220 may comprise a separate filter for each of the I and the Q branch, and similarly, the ADC unit 230 may comprise a separate ADC for each of the I and Q branch.

In some embodiments, the dynamic range (in the non-CA mode) can be increased by combining, or summing, the output signal of the first receive path 30 with the output signal of the second receive path 40, thereby generating a combined output signal. Each of the output signal from the first receive path 30 and the output signal from the second receive path 40 comprises a desired signal component and an undesired signal component (e.g. noise and distortion). When combining the output signals from the first and the second receive paths, the desired signal components in these output signals will combine constructively in the combined output signal, whereby at least uncorrelated parts (typically arising from noise, such as thermal noise) of the undesired signal components of these output signals will be effectively suppressed compared with the desired signal components in the combined output signal. In order for such suppression to be efficient, the output signal from the first receive path and the output signal from the second receive path should have a relatively small mutual phase difference. For the best performance, they should be combined in phase with each other. In phase, in this context, does not mean "exactly in phase", because that is not possible to achieve in practice, e.g. due to noise and limited computational precision, but should be interpreted as "approximately in phase" (within tolerances that depend on the implementation). With increasing mutual phase difference between the output signals from the first receive path 30 and the second receive path 40, the performance gain diminishes.

Assuming that the gain of the first and the second receive path 30, 40 are equal and their output signals are combined exactly in phase (referred to below as "the ideal case"), and that the unwanted signal components in the output signals of the first receive path 30 and the second receive path 40 are uncorrelated, an improvement in dynamic range with approximately 3 dB is obtained compared with the individual output signal from one of the first receive path 30 and the second receive path 40. If they are instead combined out-of phase with a phase difference $\phi$, the magnitude of the desired signal component in the combined output signal will be scaled with a factor $\cos(\phi/2)$ compared with the ideal case, and the corresponding signal power of the desired signal component will thus change with $20\log_{10}\cos(\phi/2)$ dB compared with the ideal case, whereas the signal power of the uncorrelated unwanted signal components will stay unchanged compared with the ideal case. Thus, also the dynamic range will change with $20\log_{10}\cos(\phi/2)$ compared with the ideal case. For example, if $\phi=20$ degrees, the dynamic range is reduced 0.13 dB compared with the ideal case. Thus, even with a relatively large phase difference such as 20 degrees, an improvement as large as 2.87 dB is obtainable.

Accordingly, in some embodiments of the present invention, the processing circuitry 70 is arranged to, in the non-CA mode, combine the output signal of the first receive path 30 with the output signal of the second receive path 40, thereby generating the combined output signal. In some of these embodiments the processing circuitry 70 is arranged to, in the non-CA mode, combine the output signal of the first receive path 30 in phase with the output signal of the second receive path 40, thereby generating the combined output signal.

Figure 7:
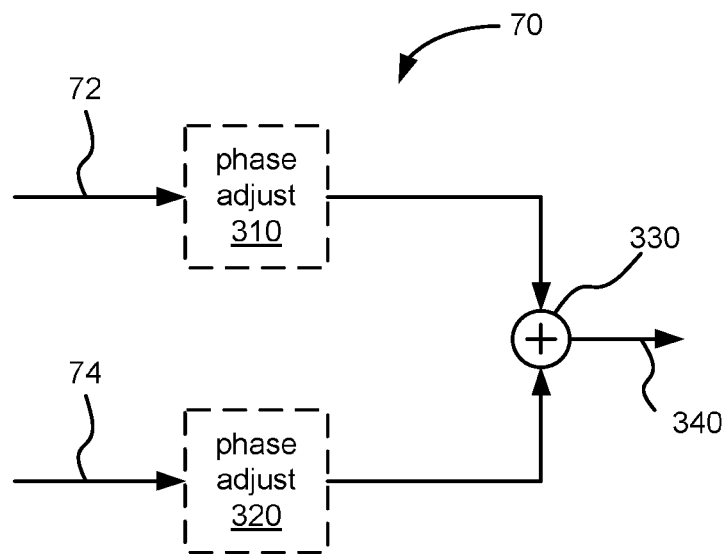

FIG. 7 illustrates an embodiment of the processing circuitry 70 arranged to combine the output signal from the first receive path 30 and the second receive path 40. As illustrated in FIG. 7, the processing circuitry 70 may comprise a phase adjust unit 310 adapted to adjust the phase of the output signal from the first receive path 30. Additionally or alternatively, the processing circuitry 70 may comprise a phase adjust unit 320 adapted to adjust the phase of the output signal from the second receive path 40. The phase adjust unit 310 and/or the phase adjust unit 320 may be adapted to adjust the phase of the output signal from the first receive path 30 and/or the output signal from the second receive path, respectively, such that they are in phase with each other before combining. Furthermore, as illustrated in FIG. 7, the processing circuitry 70 may comprise an adder unit 330 arranged to generate the combined output signal on an output 340 of the adder unit 330 by combining, or adding, the (optionally phase adjusted) output signals from the first receive path 30 and the second receive path 40. In embodiments where the processing circuitry 70 is implemented by means of a digital signal processor, any of the units 310, 320, and 330 may be implemented in software on the digital signal processor.

The phase adjust units 310 and 320 are indicated in FIG. 7 as being optional. In some embodiments, only one of them is included. Furthermore, in some embodiments, the output signals from the first receive path 30 and the second receive path 40 are already adequately phase aligned such that no phase adjustment is needed in the processing circuitry 70. For example, in embodiments where the mixer units 100 and 200 (FIG. 6) are arranged to be driven with a common LO signal in the non-CA mode, an adequate phase alignment between the output signals from the two receive paths 30 and 40 can be provided, provided that the two receive paths are relatively well matched. Alternatively, in embodiments where the mixer units 100 and 200 (FIG. 6) are arranged to be driven with separate LO signals from the LO units 110 and 210 (FIG. 6), the control unit 50 can be arranged to control the LO units 110 and 210 in order to phase align the LO signals such that an adequate phase alignment of the output signals from the two receive paths 30 and 40 is provided.

Detection of a phase difference between the output signals from the first receive path 30 and the second receive path can be performed by correlating these output signals, for example in the processing circuitry 70. Hence, in some embodiment, the processing circuitry 70 may be adapted to derive the phase difference, e.g. by correlating the output signals from the first receive path 30 and the second receive path with each other.

However, at relatively weak signal levels or in presence of relatively strong interferers (which are situations where using more than one receive path for receiving the same single CC 6 may be particularly beneficial) the convergence of such a correlation method might be relatively slow. In some embodiments, this might therefore not be sufficiently good. Another alternative that can be faster is to utilize the LO signals from the LO units 110 and 210 to detect the phase difference between the output signals from the first receive path 30 and the second receive path 40, e.g. by means of a time-to-digital converter (not shown) arranged to measure a time difference between the arrival (such as the arrival of a falling or rising edge) of the LO signals from the LO units 110 and 120. Accordingly, in some embodiments, the control unit 50 or the processing circuitry 70 is adapted to derive the phase difference between the output signals from the first receive path 30 and the second receive path 40 based on the LO signals from the LO unit 110 and the LO unit 210.

Regardless of how the phase difference between output signals from the first receive path 30 and the second receive path is derived, the processing circuitry 70 may be adapted to adjust the phase(s) of the output signal from the first receive path 30 and/or the output signal from second receive path 40 based on the derived phase difference, for example by means of the phase adjust unit 310 and/or the phase adjust unit 320. Alternatively, the control unit 50 may be adapted to control the LO unit 110 and/or the LO unit 120 to phase align the LO signals from the LO units 110 and 210.

Regardless of how the phase difference is detected and adjusted, it should be noted from the calculations above that the requirement on phase accuracy is normally relatively relaxed. For example, using the formula $20 \log_{10} \cos(\phi/2)$ dB for the dynamic-range degradation derived above, it can be concluded that if, for example, a 0.3 dB degradation (compared with the ideal case) could be acceptable, an absolute phase difference of almost 30 degrees would be OK. Thus, the detection of and adjustment of the phase difference can be made relatively coarse, which is advantageous from an implementation perspective.

The control unit 50 may be adapted to, in the non-CA mode, control at least one (in some embodiments both) of a gain and a frequency bandwidth of the first receive path 30 to be the same as that of the second receive path 40 when the first receive path 30 and the second receive path 40 are controlled to both receive the same single CC 6. For example, the filter units 120 and 220 might have a controllable gain (or attenuation) and/or a controllable frequency bandwidth. The control unit 50 may be adapted to control the gain and/or frequency bandwidth of the first receive path 30 and the second receive path 40 by controlling the filter units 120 and 220.

Figure 8:
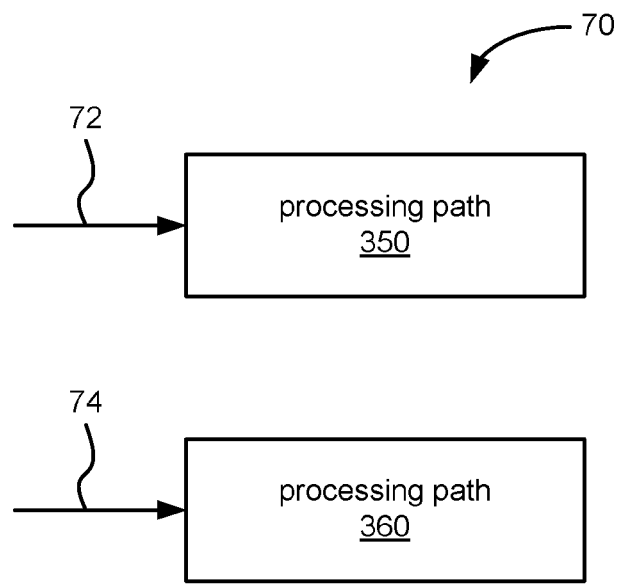

Above, embodiments have been described wherein the processing circuitry 70 is adapted to combine the output signals from the first receive path 30 and the second receive path 40. In other embodiments, the processing circuitry 70 is arranged to, in the non-CA mode, separately process an output signal of the first receive path 30 and an output signal of the second receive path 40, thereby generating a first processed signal and a second processed signal, respectively. This is illustrated in FIG. 8, wherein the processing circuitry 70 comprises a first processing path 350 arranged to separately process the output signal from the first receive path 30 and a second processing path 360 arranged to separately process the output signal from the second receive path 40. Processing of an output signal from a receive path may in this context e.g. include well-known operations such as but not limited to equalization, demodulation and decoding. It may also, as is further described below, include making signal-strength measurements.

In some situations, the power of the desired signal is unknown. An example of such a situation is when the terminal 1 performs measurements. For example, the terminal 1 may be connected to a serving cell, but periodically make measurements on neighboring cells, e.g. in order to facilitate identification of suitable targets cells for handover or for use as SCells. For a given gain setting of a receive path, the receive path has a certain dynamic range, i.e. range of input signal power levels that it is capable of handling. For an input signal power level below a lower threshold of the dynamic range, the signal would be hidden in noise and other unwanted signal components in the receive path. For an input signal power level above an upper threshold of the dynamic input range, the signal would saturate, or clip, in the receive path. The dynamic range depends on the gain setting of the receive path; with increasing gain, the receive path is capable of handling lower input signal power levels, but at the same time starts clipping, or saturating, at a lower input signal power level as well.

In such situations as mentioned above, wherein the power of the desired signal is unknown, the dynamic range of the radio receiver circuit 10 can be increased by selecting different gain settings for the first receive path 30 and the second receive path 40, and processing the output signal from the first receive path 30 and the output signal from the second receive path 40 separately. By using different gain settings, the two receive paths 30 and 40 together cover a larger range of possible input signal power levels than a single receive path would.

For the sake of illustration, consider the case when the gain of the first receive path 30 is set higher than the gain of the second receive path 40 (although it may well be the other way around in some embodiments), and wherein the dynamic ranges of the first receive path 30 and the second receive path 40 partially overlap, such that there is an overlapping range of input signal power levels that can be handled by both receive paths 30 and 40. Then there is a lower range of input signal power levels below that overlapping range that cannot be handled by the second receive path 40, but can be handled by the first receive path 30. There is also an upper range of input signal power levels above that overlapping range that cannot be handled by the first receive path 30, but can be handled by the second receive path 40. The combined dynamic range of the first receive path 30 and the second receive path 40 is then the union of the lower range, the overlapping range, and the upper range (which is the union of the dynamic range of the first receive path 30 and the second receive path 40). This combined dynamic range is larger than the dynamic range of the first receive path 30 and the dynamic range of the second receive path 40 individually.

Accordingly, in some embodiments, the control unit 50 is adapted to, in the non-CA mode, control a gain of one of the first receive path 30 and the second receive path 40 to be higher than a gain of the other one of the first receive path 30 and the second receive path 40 when the first receive path and the second receive path are controlled to both receive the same single CC 6. In some embodiments, the control unit 50 may be adapted to set the gain of said one of the receive paths 30, 40 to the highest possible gain and the gain of said other one of the receive paths 30, 40 to the lowest possible gain, thereby providing the maximum achievable dynamic range available when using two receive paths in this manner.

For the sake of comparison, consider use of a single receive path for making signal strength measurements. In that case, depending on the initial gain setting of the receive path and the input signal power level, the gain might need to be adjusted iteratively in order to find a gain setting adequate for making a reliable measurement, whereby such a measurement can be relatively slow. If instead two receive paths are used simultaneously with different gain settings as described above, the increased dynamic range facilitates an increased measurement speed, with less required gain adjustments, if any at all. For example, if the gain of one of the receive paths 30 and 40 is set to the maximum possible gain and the gain of the other one of the receive paths 30 and 40 is set to the minimum possible gain, then their combined dynamic range is such that at least one of the receive paths 30 and 40 can correctly detect an input signal with any signal power level detectable with a single receive path, without having to perform any iterative gain adjustment (provided that the individual dynamic ranges of the receive paths 30 and 40 overlap, such that there is no intermediate input signal power level for which none of the receive paths 30 and 40 can correctly detect the input signal). For such a gain setting, the measurements can be performed significantly faster than using a single receive path.

In cellular communication systems, measurements on neighboring cells can be performed in a so called compressed mode. In the compressed mode, signal transmissions are scheduled with measurement gaps, where no transmission takes place from the serving base station to the terminal, in between. During such measurement gaps, the terminal is enabled to make measurements on neighboring cells. By speeding up the measurements as described above, the terminal will be able to complete the measurements during shorter measurement gaps than would otherwise be possible, thereby enabling decreasing the duration of the measurement gaps and allowing more data to be transmitted during compressed mode. Alternatively, if the duration of the measurement gaps are not decreased, it enables more measurements to be made during each measurement gap. Furthermore, the improved measurement speed can be utilized to quickly determine a correct gain setting to be used during further reception in the non-CA mode.

Accordingly, in some embodiments, the processing circuitry 70 is arranged to perform signal-strength measurements on the output signal from the first receive path 30 and on the output signal from the second receive path 40. For example, the processing circuitry 70 may be arranged to perform signal-strength measurements on the output signal from the first receive path 30 and on the output signal from the second receive path 40 for determining a gain setting to be used during further reception in the non-CA mode. The processing circuitry 70 may be adapted to communicate said determined gain setting to the control unit 50. The control unit 50 may be adapted to control the first receive path 30 and/or the second receive path 40 to apply said determined gain setting during further reception in the non-CA mode. In some embodiments, applying the determined gain setting during further reception in the non-CA mode means applying the determined gain setting as an initial gain setting. The gain setting can then be further adjusted using an automatic gain-control (AGC) algorithm during the further reception in the non-CA mode, e.g. to account for varying reception conditions. AGC algorithms are well known in the art of radio receiver design and are not described herein in any further detail.

Above, some embodiments have been described where the processing circuitry 70, in the non-CA mode, is arranged to combine the output signals from the first processing path 30 and the second processing path 40. Furthermore, other embodiments have been described where the processing circuitry 70, in the non-CA mode, is arranged to process the output signals from the first processing path 30 and the second processing path 40 separately. In some further embodiments, the processing circuitry 70 is arranged to do both. For example, during a first time period in the non-CA mode, the control unit 50 can be adapted to control the gain of one of the first receive path 30 and the second receive path 40 to be higher than the gain of the other one of the first receive path 30 and the second receive path 40, and the processing circuitry 70 may be arranged to separately process the output signals from the first receive path 30 and the second receive path 40 and perform signal strength measurements to determine a gain setting to be used during further reception in the non-CA mode. During a second time period in the non-CA mode, after the first time period, the control unit 50 may be adapted to control the first receive path 30 and/or the second receive path 40 to apply said determined gain setting, and the processing circuitry 70 may be adapted to combine the output signals from the first receive path 30 and the second receive path. In some embodiments, depending on the signal strength, the control unit 50 may be adapted to selectively disable one of the receive paths 30 and 40 during the second time period for saving power.

According to some embodiments of the present invention, there is provided a method of operating the radio receiver circuit 10. The method comprises controlling, in the CA mode and by the control unit 50, the first receive path 30 to receive a first CC 6 of said plurality of CCs 6, 8 and the second receive path 40 to receive a second CC 8, separate from the first CC 6, of said plurality of CCs 6, 8. The method further comprises selectively controlling, in the non-CA mode and by the control unit 50, the first receive path 30 and the second receive path 40 to both receive the same single CC 6.

Figure 9:
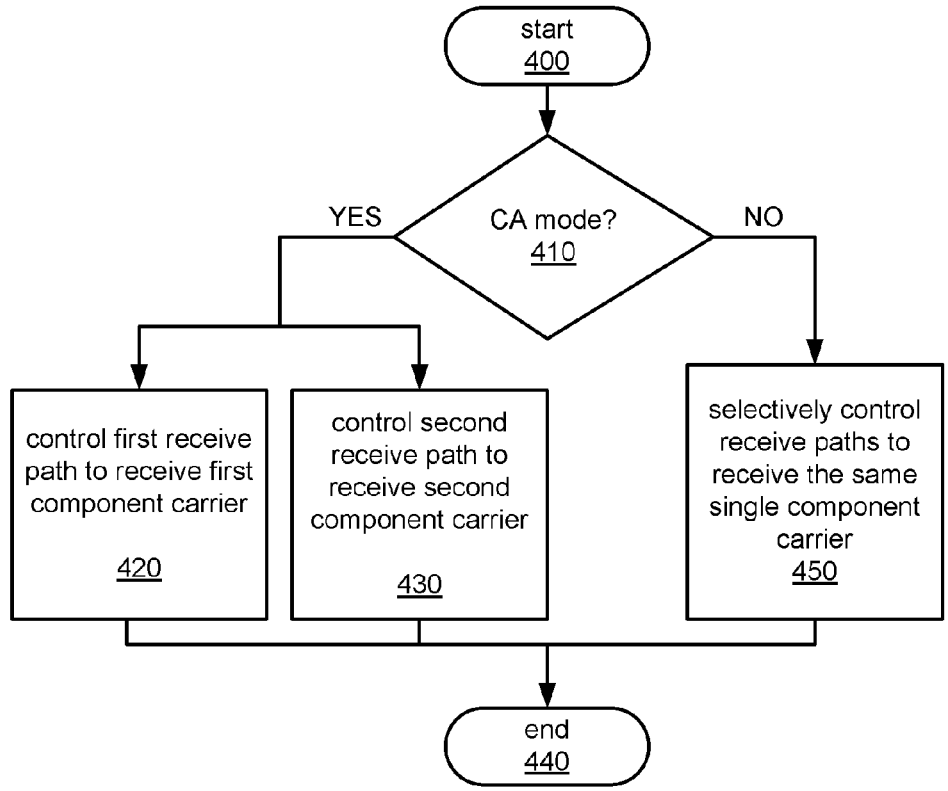
FIGS. 9-10 show flow charts according to embodiments of the present invention.

An embodiment of the method is illustrated with a flow chart in FIG. 9. The operation is started in step 400. In step 410, it is checked whether the radio receiver circuit 10 operates in the CA mode or the non-CA mode. If it operates in the CA mode (YES branch from step 410), the control unit 50 controls the first receive path 30, in step 420, to receive the first CC 6 and the second receive path 40, in step 430, to receive the second CC 8. The operation of the method is then ended in step 440. If the radio receiver circuit 10 operates in the non-CA mode (NO branch from step 410), the control unit 50 selectively controls, in step 450, the first receive path 30 and the second receive path 40 to both receive the same single CC 6. The operation of the method is then ended in step 440.

Figure 10:
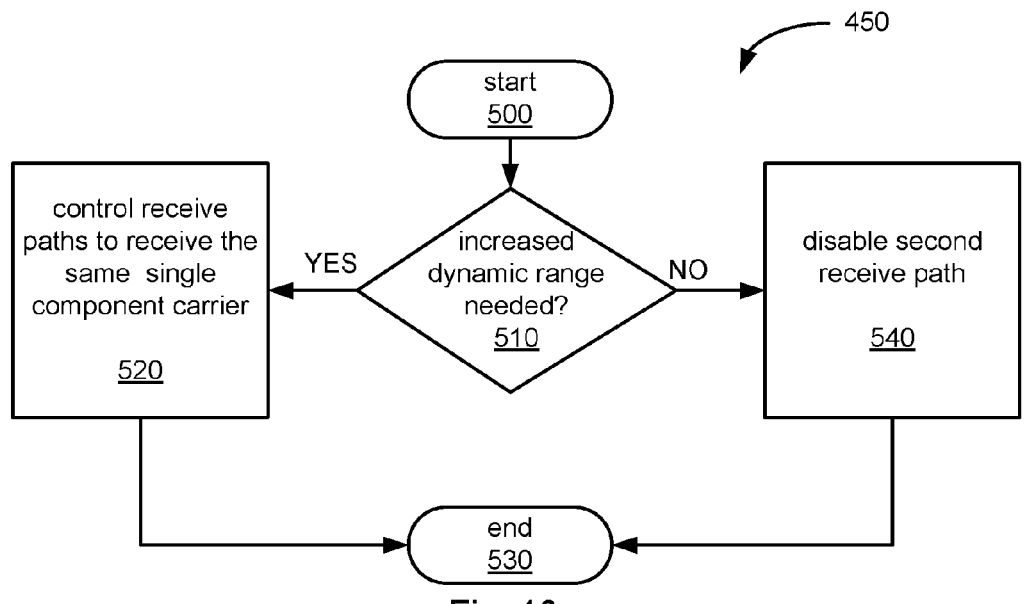

As indicated above in the context of embodiments of the radio receiver circuit 10, selectively controlling the first receive path 30 and the second receive path 40 to both receive the same single CC 6 can, in some embodiments, include controlling the first receive path 30 and the second receive path 40 to both receive the same single CC 6 when an increased dynamic range (compared with using a single receive path) is needed, and otherwise disabling the second receive path 40 for saving power. As mentioned above, an increased dynamic range can e.g. be needed in situations where the received signal is relatively weak, situations with presence of blocking interferer(s), and during signal measurements when the strength of the received signal is initially unknown to the radio receiver circuit 10. FIG. 10 is a flow chart for an embodiment of step 450 (FIG. 9). The operation of step 450 is started in step 500. In step 510, it is checked by the control unit 50 whether an increased dynamic range is needed. If so (YES branch from step 510), the control unit 50 controls the first receive path 30 and the second receive path 40 to both receive the same single CC 6. Then, the operation of step 450 is ended in step 530. If not (NO branch from step 510), the control unit 50 disables the second receive path 40 for saving power. Then, the operation of step 450 is ended in step 530.

Embodiments of the present invention provides a capability for boosting the dynamic range of a radio receiver circuit during non-CA operation by efficiently reusing circuitry intended for receiving multiple CCs during CA operation. The reuse of circuitry intended for receiving multiple CCs using CA operation for providing the boost in dynamic range is advantageous, for instance in that relatively little overhead, e.g. in terms of hardware, is needed for providing the boost in dynamic range.

Figure 11:
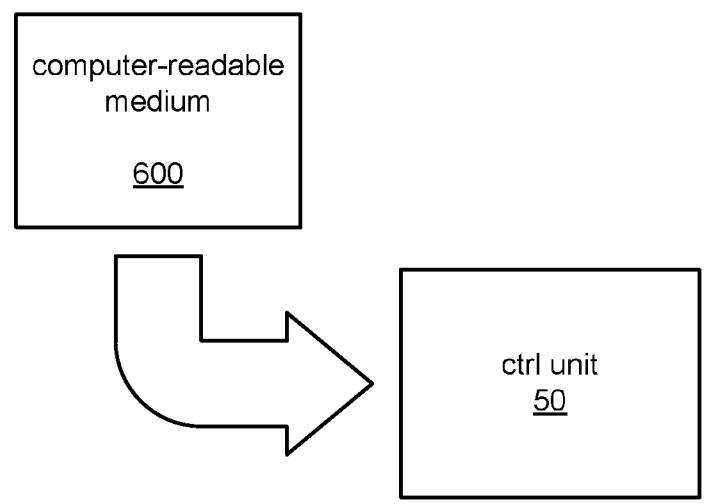
FIG. 11 schematically illustrates a computer-readable medium and a control unit.

In some embodiments, the control unit 50 may be implemented as a dedicated application-specific hardware unit. Alternatively, the control unit 50, or parts thereof, may be implemented with programmable and/or configurable hardware units, such as but not limited to one or more field-programmable gate arrays (FPGAs), processors, or microcontrollers. Thus, the control unit 50 may be a programmable control unit. Hence, embodiments of the present invention may be embedded in a computer program product, which enables implementation of the method and functions described herein. Therefore, according to embodiments of the present invention, there is provided a computer program product, comprising instructions arranged to cause the programmable control unit to perform the steps of any of the embodiments of said methods. The computer program product may comprise program code which is stored on a computer readable medium 600, as illustrated in FIG. 11, which can be loaded and executed by said programmable control unit, to cause it to perform the steps of any of the embodiments of said methods. The computer-readable medium 600 may e.g. be a non-transitory computer-readable medium.

The present invention has been described above with reference to specific embodiments. However, other embodiments than the above described are possible within the scope of the invention. Different method steps than those described above, performing the method by hardware or software, may be provided within the scope of the invention. The different features and steps of the embodiments may be combined in other combinations than those described. The scope of the invention is only limited by the appended patent claims.

The invention claimed is:

1. A radio receiver circuit configured to operate in a carrier-aggregation (CA) mode, wherein the radio receiver circuit is to receive a plurality of component carriers (CCs) and in a non-CA mode, wherein the radio receiver circuit is to receive a single CC, comprising:
    a first receive path arranged to be operatively connected to an antenna;
    a second receive path arranged to be operatively connected to the same antenna; and
    a processing circuit operatively connected to the first receive path and the second receive path; wherein
    the processing circuit is adapted to, in the CA mode, control the first receive path to receive a first CC of said plurality of CCs and control the second receive path to receive a second CC, separate from the first CC, of said plurality of CCs; and
    the processing circuit is adapted to, in the non-CA mode, selectively control the first receive path and the second receive path to both receive the same single CC.

2. The radio receiver circuit of claim 1, comprising a low-noise amplifier arranged to operatively connect both the first receive path and the second receive path to the antenna.

3. The radio receiver circuit of claim 1, wherein:
    the first receive path comprises a mixer unit arranged to be driven by a first local oscillator, LO, signal;
    the second receive path comprises a mixer unit arranged to be driven by a second LO signal;
    the processing circuit is adapted to, in the CA mode, control the frequency of the first LO signal to enable reception of the first CC by the first receive path and control the frequency of the second LO signal to enable reception of the second CC by the second receive path.

4. The radio receiver circuit of claim 3, wherein the processing circuit is adapted to, in the non-CA mode and in order to enable reception of the same single CC by both the first receive path and the second receive path, control the frequency of the first LO signal to be the same as the frequency of the second LO signal.

5. The radio receiver circuit of claim 1, wherein the processing circuit is arranged to, in the non-CA mode, combine an output signal of the first receive path with an output signal of the second receive path, thereby generating a combined output signal.

6. The radio receiver circuit of claim 5, wherein the processing circuit is adapted to, in the non-CA mode, control at least one of a gain and a frequency bandwidth of the first receive path to be the same as that of the second receive path when the first receive path and the second receive path are controlled to both receive the same single CC.

7. The radio receiver circuit of claim 1, wherein the processing circuit is arranged to, in the non-CA mode, separately process an output signal of the first receive path and an output signal of the second receive path, thereby generating a first processed signal and a second processed signal, respectively.

8. The radio receiver circuit of claim 7, wherein the processing circuit is adapted to, in the non-CA mode, control a gain of one of the first receive path and the second receive path to be higher than a gain of the other one of the first receive path and the second receive path when the first receive path and the second receive path are controlled to both receive the same single CC.

9. The radio receiver circuit of claim 8, wherein the processing circuit is arranged to perform signal-strength measurements on the output signal from the first receive path and on the output signal from the second receive path.

10. The radio receiver circuit of claim 9, wherein the processing circuit is arranged to perform said signal-strength measurements to determine a gain setting to be used during further reception in the non-CA mode.

11. The radio receiver circuit of claim 1, wherein the processing circuit is adapted to, in the non-CA mode, selectively disable the second receive path.

12. The radio receiver circuit of claim 1, wherein the radio receiver circuit is adapted to operate in a cellular communication system.

13. A radio communication apparatus comprising:
the radio receiver circuit of claim 1; and
an antenna, to which both the first receive path and the second receive path of the radio receiver circuit are operatively connected.

14. The radio communication apparatus of claim 13, wherein the radio communication apparatus is a terminal for a cellular communication system.

15. The radio communication apparatus of claim 14, wherein the terminal is a mobile telephone, a tablet computer, a portable computer, or a machine-type communication device.

16. A method of operating a radio receiver circuit configurable to operate in a carrier-aggregation (CA) mode, wherein the radio receiver circuit is to receive a plurality component carriers (CCs) and in a non-CA mode, wherein the radio receiver circuit is to receive a single frequency CC, wherein the radio receiver circuit comprises:
a first receive path operatively connected to an antenna;
a second receive path operatively connected to the same antenna; and
a processing circuit operatively connected to the first receive path and the second receive path; wherein
the method comprises
controlling, in the CA mode and by the processing circuit, the first receive path to receive a first CC of said plurality of frequency bands and the second receive path to receive a second CC, separate from the first CC, of said plurality of CCs; and
selectively controlling, in the non-CA mode and by the processing circuit, the first receive path and the second receive path to both receive the same single CC.

17. A non-transitory computer-readable medium comprising, stored thereupon, a computer program product comprising computer program code that, when executed by a processing circuit of a radio receiver circuit configured to operate in a carrier-aggregation (CA) mode, wherein the radio receiver circuit is to receive a plurality component carriers (CCs) and in a non-CA mode, wherein the radio receiver circuit is to receive a single frequency CC, wherein the radio receiver circuit comprises a first receive path arranged to be operatively connected to an antenna, a second receive path arranged to be operatively connected to the same antenna, and the processing circuit operatively connected to the first receive path and the second receive path, causes the processing circuit to:
in the CA mode, control the first receive path to receive a first CC of said plurality of CCs and control the second receive path to receive a second CC, separate from the first CC, of said plurality of CCs; and
in the non-CA mode, selectively control the first receive path and the second receive path to both receive the same single CC.

\* \* \* \* \*